United States Patent
Wu

(10) Patent No.: US 10,490,593 B2
(45) Date of Patent: Nov. 26, 2019

(54) ACTIVE MATRIX IMAGE SENSING DEVICE

(71) Applicant: INNOLUX CORPORATION, Jhu-Nan, Miao-Li County (TW)

(72) Inventor: Chih-Hao Wu, Chu-Nan (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 16/369,787

(22) Filed: Mar. 29, 2019

(65) Prior Publication Data
US 2019/0229146 A1  Jul. 25, 2019

Related U.S. Application Data

(62) Division of application No. 15/659,113, filed on Jul. 25, 2017.

(30) Foreign Application Priority Data

Jul. 25, 2016 (CN) .......................... 2016 1 0587058

(51) Int. Cl.
| | |
|---|---|
| *H01L 27/146* | (2006.01) |
| *G01T 1/20* | (2006.01) |
| *H01L 27/12* | (2006.01) |
| *H01L 29/786* | (2006.01) |

(52) U.S. Cl.
CPC ...... *H01L 27/14663* (2013.01); *G01T 1/2002* (2013.01); *H01L 27/1462* (2013.01); *H01L 27/14612* (2013.01); *H01L 27/14625* (2013.01); *H01L 27/14629* (2013.01); *H01L 27/1214* (2013.01); *H01L 27/14692* (2013.01); *H01L 29/7869* (2013.01); *H01L 29/78669* (2013.01)

(58) Field of Classification Search
CPC ......... H01L 27/14629; H01L 27/14663; G01T 1/2002
See application file for complete search history.

(56) References Cited

U.S. PATENT DOCUMENTS

| | | | |
|---|---|---|---|
| 2008/0245968 A1 | 10/2008 | Tredwell et al. | |
| 2015/0338529 A1* | 11/2015 | Svenonius | ............ G01T 1/2002 250/486.1 |
| 2016/0329368 A1 | 11/2016 | Ohmaru | |

FOREIGN PATENT DOCUMENTS

TW        201602618 A      1/2016

* cited by examiner

*Primary Examiner* — Daniel P Shook
(74) *Attorney, Agent, or Firm* — Muncy, Geissler, Olds & Lowe, P.C.

(57) ABSTRACT

An active matrix image sensing device includes an image sensing substrate and a scintillator substrate. The image sensing substrate has a plurality of image sensing pixels. The scintillator substrate is disposed opposite to the image sensing substrate and includes a first substrate, a plurality of guiding members, a reflective layer and a scintillator layer. The guiding members are disposed on the first substrate and protruded from the first substrate toward the image sensing substrate. The guiding members are located corresponding to the image sensing pixels, respectively. The reflective layer is disposed on the guiding members, and the scintillator layer is disposed between the reflective layer and the image sensing substrate.

9 Claims, 9 Drawing Sheets

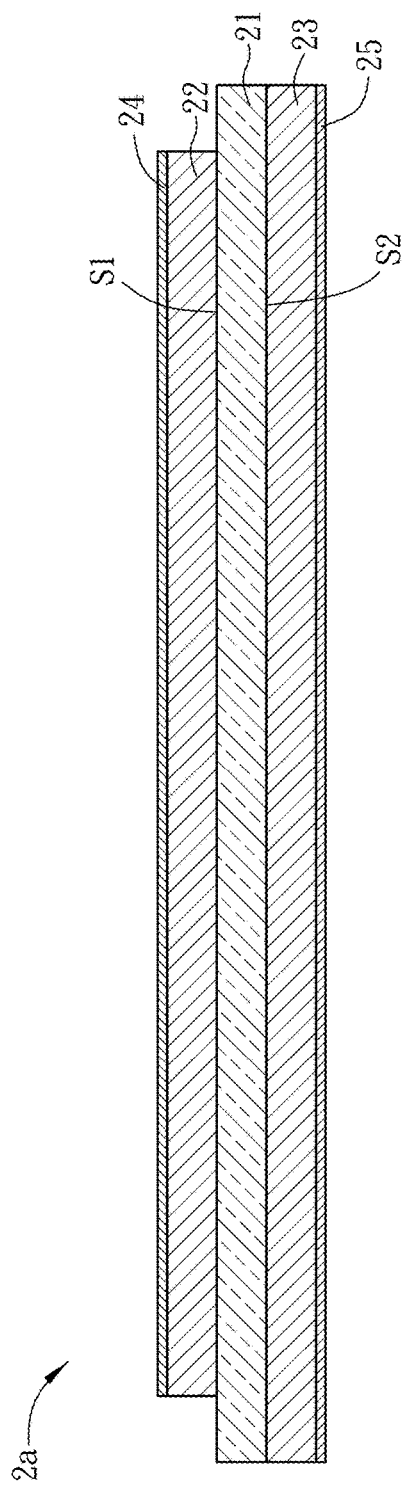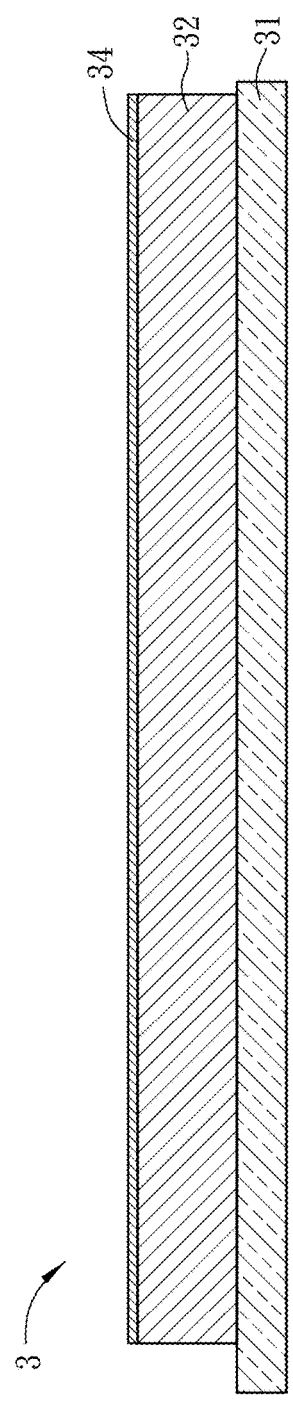
FIG. 6A
FIG. 6B

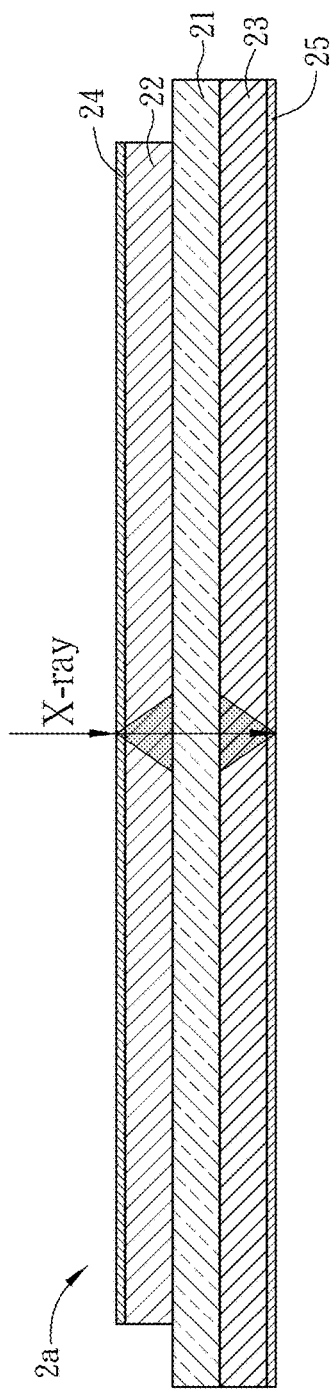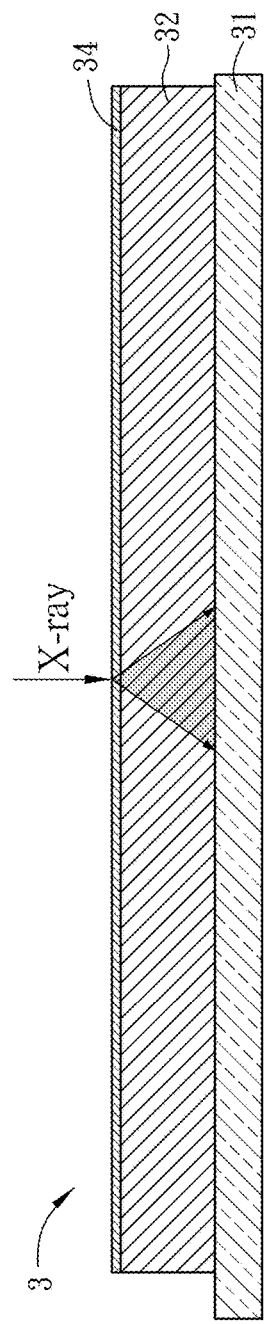
FIG. 7A
FIG. 7B

ACTIVE MATRIX IMAGE SENSING DEVICE

CROSS REFERENCE TO RELATED APPLICATIONS

This application is a Divisional Application of an earlier filed, pending, application, having application Ser. No. 15/659,113 and filed on Jul. 25, 2017, the content of which, including drawings, is expressly incorporated by reference herein.

BACKGROUND

Technical Field

The present disclosure relates to an image sensing device and, in particular, to an active matrix image sensing device.

Related Art

In the traditional X-ray imaging technology, the film can be exposed to X-ray to form the image. Recently, due to the development of semiconductor technology, the X-ray imaging technology is also progressed to utilize the digital image sensing panel for forming the image. This is also known as the digital radiography (DR) technology.

The theory of the digital radiography technology will be briefly described hereinafter. After the X-ray enters the image sensing device, it will pass through a scintillator layer for transforming the X-ray to the visible light. The light sensing element of the sensing panel can receive the visible light and transform it into electronic signals, which are read out through the data lines and then processed to form the image.

Of course, when the X-ray passes through the scintillator layer and is transformed to the visible light, the generated visible light is non-directional. In other words, the direction of the visible light does not totally match the direction of the X-ray, so the visible light can't be entirely sensed by the light sensing element. This will reduce the imaging spatial resolution of the image sensing device. Therefore, it is desired to improve the imaging spatial resolution of the X-ray image sensing device.

Besides, since the flexible substrate has been developed, the manufacturers also consider to use the flexible substrate in the fabrication of the light sensing element of the active matrix sensing panel. Accordingly, it is also desired to manufacture an X-ray image sensing device with high imaging spatial resolution and good flexibility.

SUMMARY

According to some embodiments, an objective of the present disclosure is to provide an active matrix image sensing device having high spatial resolution.

According to some embodiments, an objective of the present disclosure is to provide an active matrix image sensing device having high spatial resolution and good flexibility for various applications.

An active matrix image sensing device includes an image sensing substrate and a scintillator substrate. The image sensing substrate has a plurality of image sensing pixels. The scintillator substrate is disposed opposite to the image sensing substrate and includes a first substrate, a plurality of guiding members, a reflective layer and a scintillator layer. The guiding members are disposed on the first substrate and protruded from the first substrate toward the image sensing substrate. The guiding members are located corresponding to the image sensing pixels, respectively. The reflective layer is disposed on the guiding members, and the scintillator layer is disposed between the reflective layer and the image sensing substrate.

In addition, the disclosure also discloses an active matrix image sensing device, which includes an image sensing substrate, a first scintillator layer and a second scintillator layer. The image sensing substrate includes a flexible substrate. Besides, the image sensing substrate has a first surface and a second surface, which are opposite to each other. The first scintillator layer is disposed on the first surface of the image sensing substrate. The second scintillator layer is disposed on the second surface of the image sensing substrate.

BRIEF DESCRIPTION OF THE DRAWINGS

The embodiments will become more fully understood from the detailed description and accompanying drawings, which are given for illustration only, and thus are not limitative of the present disclosure, and wherein:

FIG. 6A is another schematic diagram of the active matrix image sensing device;

FIG. 6B is a schematic diagram showing a comparison example of the active matrix image sensing device; and FIGS. 7A and 7B are schematic diagrams showing the spatial resolutions of the active matrix image sensing devices of FIGS. 6A and 6B.

DETAILED DESCRIPTION OF THE DISCLOSURE

The embodiments of the disclosure will be apparent from the following detailed description, which proceeds with reference to the accompanying drawings, wherein the same references relate to the same elements. Moreover, the drawings of all implementation are schematic, and they do not mean the actual size and proportion. The terms of direction recited in the disclosure, for example up, down, left, right, front, or rear, only define the directions according to the accompanying drawings for the convenience of explanation but not for limitation. The names of elements and the wording recited in the disclosure all have ordinary meanings in the art unless otherwise stated. Therefore, a person skilled in the art can unambiguously understand their meanings.

Figure 1:
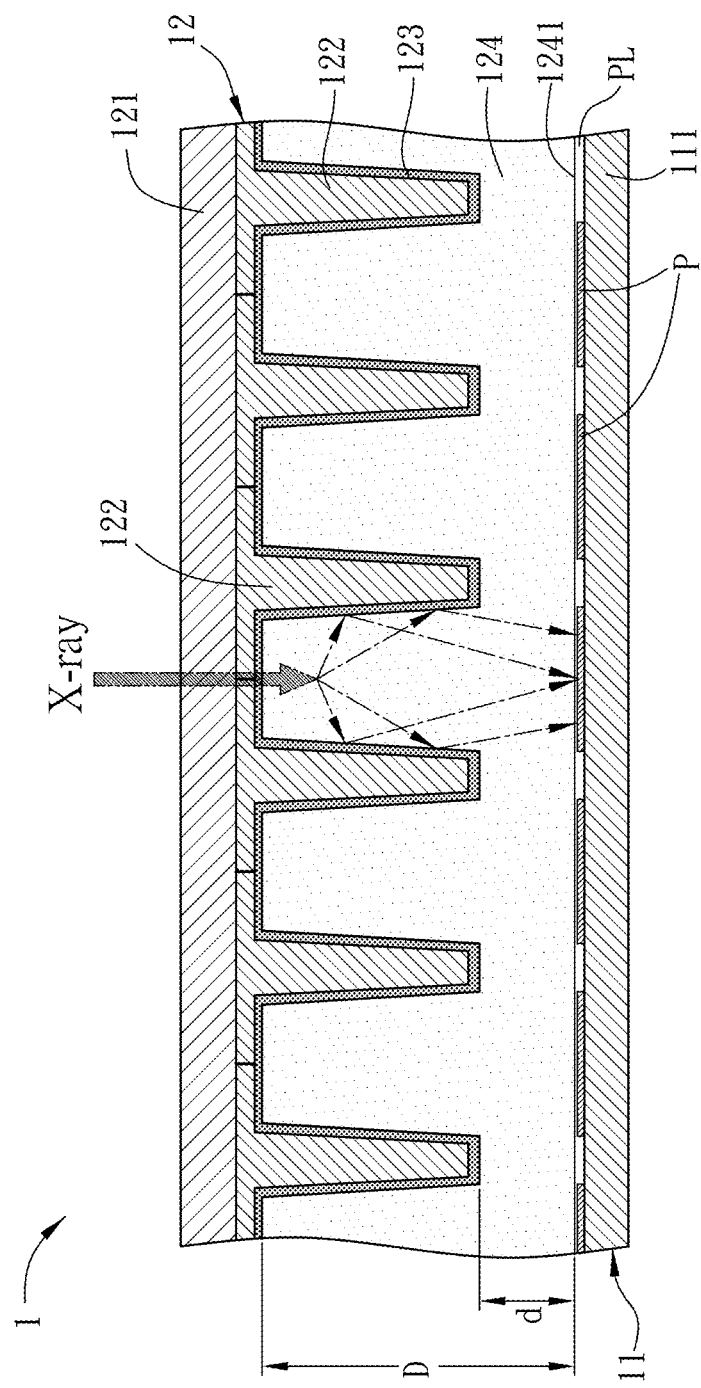
FIG. 1 is a sectional view of an active matrix image sensing device according to an embodiment of the disclosure.
Figure 2A:
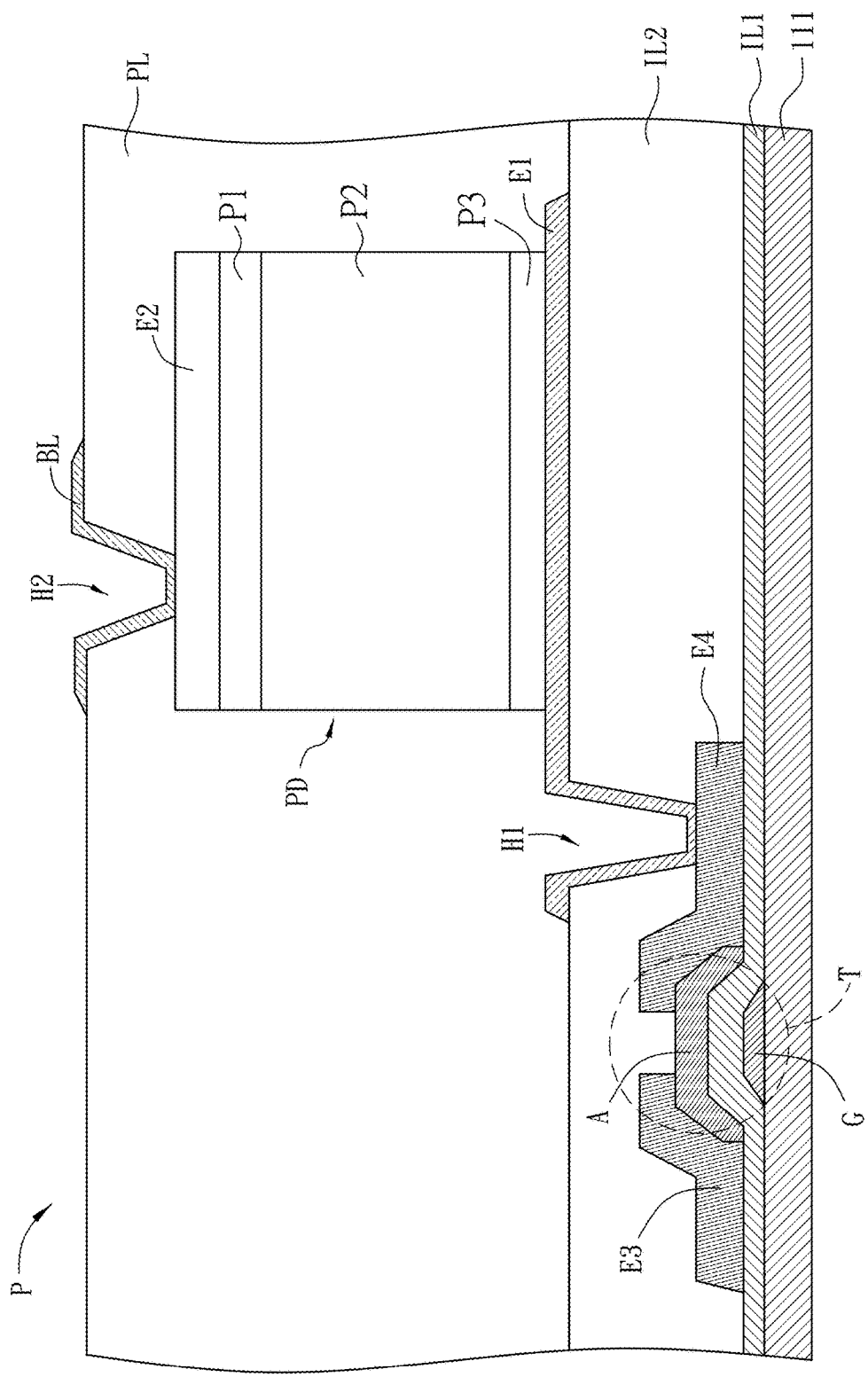
FIG. 2A is a schematic diagram showing the structure of an image sensing pixel of the image sensing substrate in the active matrix image sensing device of FIG. 1.
Figure 2B:
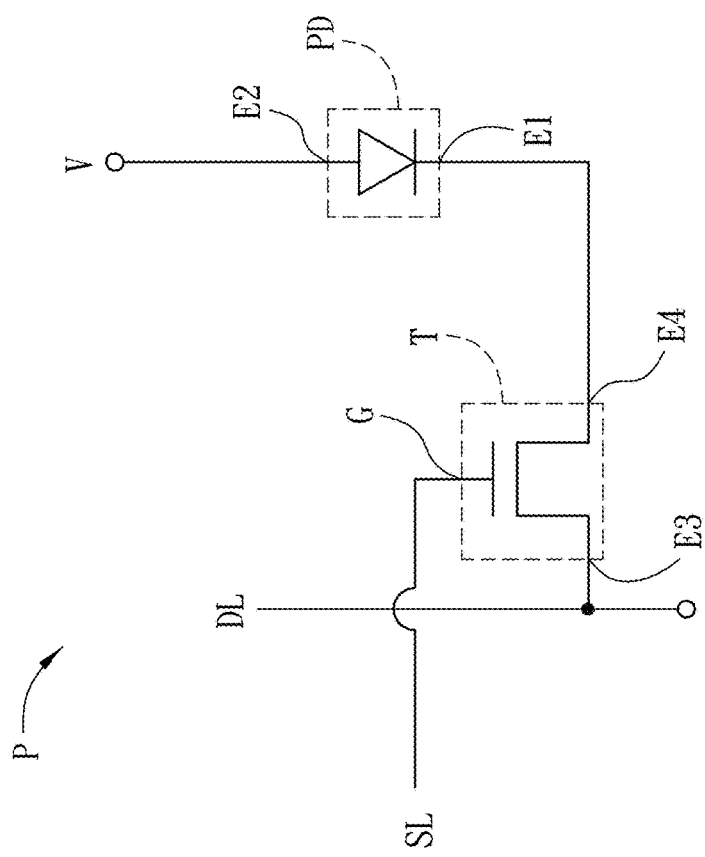
FIG. 2B is a schematic diagram showing an equivalent circuit of an image sensing pixel of the image sensing substrate in the active matrix image sensing device of FIG. 1.

FIG. 1 is a sectional view of an active matrix image sensing device 1 according to an embodiment of the disclosure. FIG. 2A is a schematic diagram showing the structure of an image sensing pixel P of an image sensing substrate 11 in the active matrix image sensing device 1 of FIG. 1. FIG. 2B is a schematic diagram showing an equivalent circuit of an image sensing pixel P of an image sensing substrate 11 in the active matrix image sensing device 1 of FIG. 1.

Referring to FIGS. 1, 2A and 2B, the active matrix image sensing device 1 includes an image sensing substrate 11 and a scintillator substrate 12, which are disposed opposite to each other.

The image sensing substrate 11 has a plurality of image sensing pixels P, which are disposed on a substrate 111. In practice, the substrate 111 can be made of a transparent material, such as glass, quartz or the likes, plastics, rubbers, glass fibers, or other polymers. For example, the substrate 111 can be an alumino silicate glass substrate. Alternatively, the substrate 111 can be made of an opaque material, such as a metal-glass fiber complex plate or a metal-ceramic complex plate.

As shown in FIGS. 2A and 2B, the image sensing pixel P includes a scan line SL, a data line DL, a light sensing element PD and a TFT (thin-film-transistor) element T. Besides, the image sensing pixel P further includes an insulation layer IL2, a planarization layer PL and a conductive layer BL. The scan line SL, data line DL, light sensing element PD, TFT element T, insulation layer IL2, planarization layer PL, and conductive layer BL are disposed on the substrate 111. To be noted, FIGS. 2A and 2B only show one image sensing pixel P for an example, and the active matrix image sensing device 1 includes a plurality of image sensing pixels P arranged in a matrix. The multiple data lines DL and multiple scan lines SL are intersected with each other for defining the image sensing pixels P.

The data line DL is intersected with the scan line SL. The light sensing element PD includes a first terminal electrode E1 and a second terminal electrode E2. The second terminal electrode E1 is electrically connected to a reference voltage V, which provides a bias voltage to the light sensing element PD. The first terminal electrode E1 and the second terminal electrode E2 can be configured by a transparent electrode layer, which is made of, for example but not limited to, indium-tin oxide (ITO) or indium-zinc oxide (IZO). Alternatively, the first terminal electrode E1 can be a metal layer, and the second terminal electrode E2 can be a transparent electrode layer. This disclosure is not limited.

In addition, the light sensing element PD further includes a first semiconductor layer P1, an intrinsic semiconductor layer P2, and a second semiconductor layer P3, and the intrinsic semiconductor layer P2 is disposed between the first semiconductor layer P1 and the second semiconductor layer P3. The first semiconductor layer P1 is directly contacted with and electrically connected to the second terminal electrode E2, and the second semiconductor layer P3 is directly contacted with and electrically connected to the first terminal electrode E1. In this case, the light sensing element PD is an NIP type photo diode, which is made by a-Si thin film deposition. In this embodiment, the first semiconductor layer is a P type semiconductor, and the second semiconductor layer is an N type semiconductor. This disclosure is not limited thereto. In other embodiments, the first semiconductor layer is an N type semiconductor, and the second semiconductor layer is a P type semiconductor.

The TFT element T is, for example an N type amorphous silicon thin-film transistor and includes a gate G, an insulation layer (or a gate insulation layer) IL1, a channel layer A, a first electrode E3 and a second electrode E4. The gate G is disposed on the substrate 111 and electrically connected to the scan line SL. The gate G can be a single layer structure or a multilayer structure, which is made of metal (e.g. Al, Cu, Ag, Mo or Ti) or alloys thereof. Some traces for transmitting the driving signals (e.g. the scan lines) can be formed in the same layer of the gate G with one manufacturing process, and they can be electrically connected to each other.

The insulation layer IL1 is disposed on the gate G. The insulation layer IL is made of organic material (e.g. organic silicon oxides) or inorganic material (e.g. silicon nitride, silicon oxide, silicon oxynitride, silicon carbide, aluminum oxide, hafnium oxide or a multilayer structure of the above materials). The (gate) insulation layer IL1 can completely cover the gate G and partially or totally covers the substrate 111.

The channel layer A is disposed on the insulation layer IL1 and is located corresponding to the gate G. In practice, the channel layer A may include a semiconductor oxide. The semiconductor oxide can be an oxide of a metal, and the metal is selected from the group consisting of indium, gallium, zinc, tin, and combinations thereof. Thus, the TFT element T is a metal oxide thin-film transistor. The semiconductor oxide is, for example but not limited to, indium gallium zinc oxide (IGZO) The metal oxide thin-film transistor has low leak current (between $10^{-14}$ A to $10^{-18}$ A), high electronic energy gap (about 3.1 eV) and low light sensitivity, and is an enhancement mode transistor.

The first electrode E3 and the second electrode E4 are disposed on the channel layer A, and are contacted with the channel layer A. When the channel layer A of the TFT element T is not conducted, the first electrode E3 and the second electrode E4 are electrically isolated. In this case, the first electrode E3 can be a drain of the TFT element T and electrically connected to the data line DL, and the second electrode E4 can be a source of the TFT element T and electrically connected to the first terminal electrode E1 of the light sensing element PD.

The insulation layer IL2 is configured to cover the first electrode E3, the second electrode E4 and the channel layer A. The insulation layer IL2 has a through hole H1 extending toward the TFT element T, so that the first terminal electrode E1 and the second electrode E4 can be electrically connected through the through hole H1. The first electrode E3 and the second electrode E4 can be a single layer structure or a multilayer structure, which is made of metal (e.g. Al, Cu, Ag, Mo or Ti) or alloys thereof. Some traces for transmitting the driving signals (e.g. the data lines) can be formed in the same layer of the first electrode E3 and the second electrode E4 with one manufacturing process.

To be noted, the TFT element T of this embodiment is a bottom-gate type transistor. In other embodiments, the TFT element T can be a top-gate type transistor, and this disclosure is not limited. In addition, the first electrode E3 and the second electrode E4 of the TFT element T of this embodiment are directly disposed on the channel layer A. In other embodiments, the first electrode E3 and the second electrode E4 of the TFT element T can be disposed on an etch stop layer (not shown), and one ends of the first electrode E3 and the second electrode E4 are contacted with the channel layer A via an opening of the etch stop layer. The etch stop layer can be made of organic material (e.g. organic silicon oxides) or inorganic material (e.g. silicon nitride, silicon oxide, silicon oxynitride, silicon carbide, aluminum oxide, hafnium oxide). The etch stop layer can be a single layer or a multilayer structure including any combination of the above materials.

The planarization layer PL is disposed on the insulation layer IL2 and covers the insulation layer IL2 and the light sensing element PD. The planarization layer PL is configured for providing a planarization effect. The conductive layer BL is disposed on the planarization layer PL and is electrically connected with the second terminal electrode E2 of the light sensing element PD via a through hole H2 of the planarization layer PL. The conductive layer BL can be made of a transparent material (e.g. ITO) or an opaque material, and the planarization layer PL can be made of SiOx, SiNx or polyfluoroalkoxy (PFA).

Referring to FIG. 1, the scintillator substrate 12 includes a substrate 121, a plurality of guiding members 122, a reflective layer 123, and a scintillator layer 124.

The substrate 121 can be made of a transparent material, such as glass, quartz or the likes, plastics, rubbers, glass fibers, or other polymers. For example, the substrate 121 can be an alumino silicate glass substrate. Alternatively, the substrate 121 can be made of an opaque material, such as a metal-glass fiber complex plate or a metal-ceramic complex plate.

The guiding members 122 are disposed on the substrate 121 and protruded from the substrate 121 toward the image sensing substrate 11, and the guiding members 122 are located corresponding to the image sensing pixels P, respectively. In this embodiment, each guiding member 122 includes a base portion and a protruding portion. The guiding members 122 are arranged in a 2D matrix, so that the guiding members 122 are located corresponding to the image sensing pixels P, respectively.

Figure 2C:
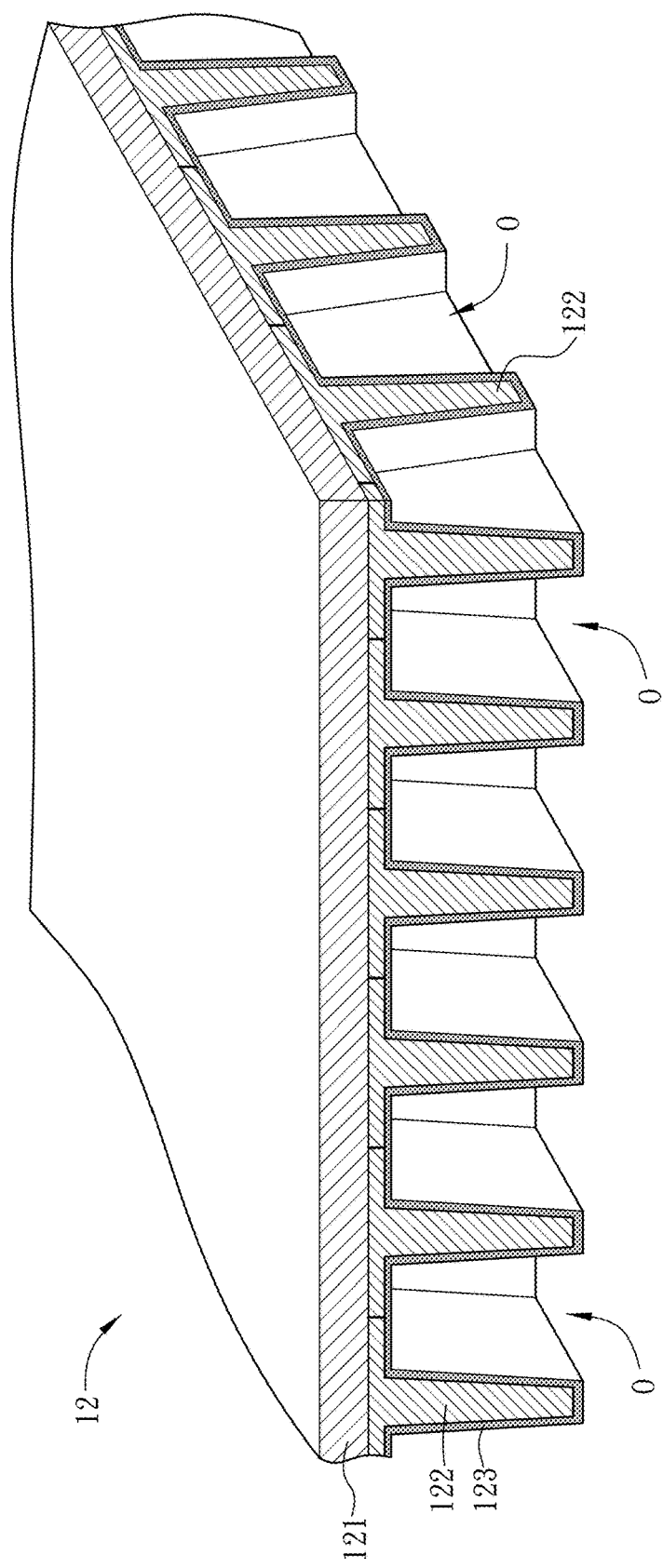
FIG. 2C is a perspective diagram of a scintillator substrate of the embodiment.

FIG. 2C is a perspective diagram of a scintillator substrate 12 of the embodiment. In order to clearly describe the structure of the guiding member 122, the scintillator 124 of the scintillator substrate 12 is not shown in FIG. 2C.

Referring to FIG. 2C, in this embodiment, the guiding member 122 is formed by barrier ribs, which are disposed at the periphery and extended downwardly. One guiding member 122 includes the barrier ribs in the periphery and an opening O inside the barrier ribs. Any two adjacent guiding members 122 have a common barrier rib. Each opening O is facing toward one image sensing pixel P and is located corresponding to the image sensing pixel P. The pitch of the guiding members 122 can be the same as the pitch of the image sensing pixels P of the image sensing substrate 11. The guiding member 122 can be made of polymer complex material, such as, for example but not limited to, glass fibers.

Referring to FIGS. 1 and 2C, the reflective layer 123 is disposed on the guiding members 122. In this embodiment, the reflective layer 123 blanketly covers the guiding members. That is, the reflective layer 123 covers the barrier ribs of the guiding members 112, the openings O corresponding to the image sensing pixels P, and the tops of the guiding members 122 facing the image sensing substrate. The reflective layer 123 is, for example, a metal coating layer or a reflective coating layer, which is made of reflective materials. The reflective materials may include metal (e.g. Al), metal oxide (e.g. $TiO_2$), high reflective paint, facet coating, or their combinations, and this disclosure is not limited.

The scintillator layer 124 is disposed between the reflective layer 123 and the image sensing substrate 11. In this embodiment, the scintillator layer 124 is a partial pixelated scintillator layer, which includes a plurality of scintillators. The scintillators can be organic scintillators, inorganic scintillators or gas scintillators. In one embodiment, the scintillator layer 124 is made of, for example but not limited to, gadolinium oxide sulfur (GOS, $Gd_2O_2S$), which can transform the X-ray into visible light.

In addition, the scintillator layer 124 has a top surface 1241 facing the image sensing substrate 11. A minimum distance d between the top surface 1241 and the reflective layer 123 is between 20 μm and 200 μm. In some embodiments, the minimum distance d between the top surface 1241 and the reflective layer 123 is between 50 μm and 200 μm. In one embodiment, a maximum distance D between the top surface 1241 and the reflective layer 123 (the maximum thickness of the scintillator layer 124) can be 300 μm, and the minimum distance d can be 100 μm.

When the X-ray enters the scintillator substrate 12 and passes through the substrate 121, the guiding member 122, the reflective layer 123 and reaches to the scintillator layer 124 in order, the scintillators of the scintillator layer 124 can transform the X-ray into visible light. Moreover, the reflective layer 123, which is formed on the guiding members 122 can reflect the generated visible light, thereby restricting the traveling path of the visible light and guiding the visible light downwardly to the light sensing element PD of the image sensing pixels P. Accordingly, the light sensing element PD of the image sensing pixels P can sense and receive the visible light. When the visible light enters the light sensing element PD, the electron-hole pairs are separated so as to generate current (light sensing signal). Then, when the scan lines SL sequentially receive a conducting signal so as to enable the corresponding TFT elements T, thereby sequentially reading out the light sensing signals to form image data.

According to some embodiments, in the active matrix image sensing device 1, by means of disposing guiding members 122 on the scintillator substrate 12 in the position corresponding to the pixelated patterns of the image sensing substrate 11, disposing the reflective layer 123 on the guiding members 122, and disposing the scintillator layer 124 between the reflective layer 123 and the image sensing substrate 11, the traveling path of the light can be restricted. Accordingly, the spatial resolution of the active matrix image sensing device 1 can be improved.

To be noted, the scintillator layer 124 is disposed inside the openings O of the guiding members 122 and is also disposed between the reflective layer 123 and the image sensing substrate 11. This configuration is because that a part of the X-ray may directly penetrate through the guiding member 122 and the reflective layer 123 and leave the image sensing substrate 11 if the scintillators are not configured between the reflective layer 123 and the image sensing substrate 11, which may cause the incomplete transform of the X-ray and result the incorrect light sensing signal.

Figure 3:
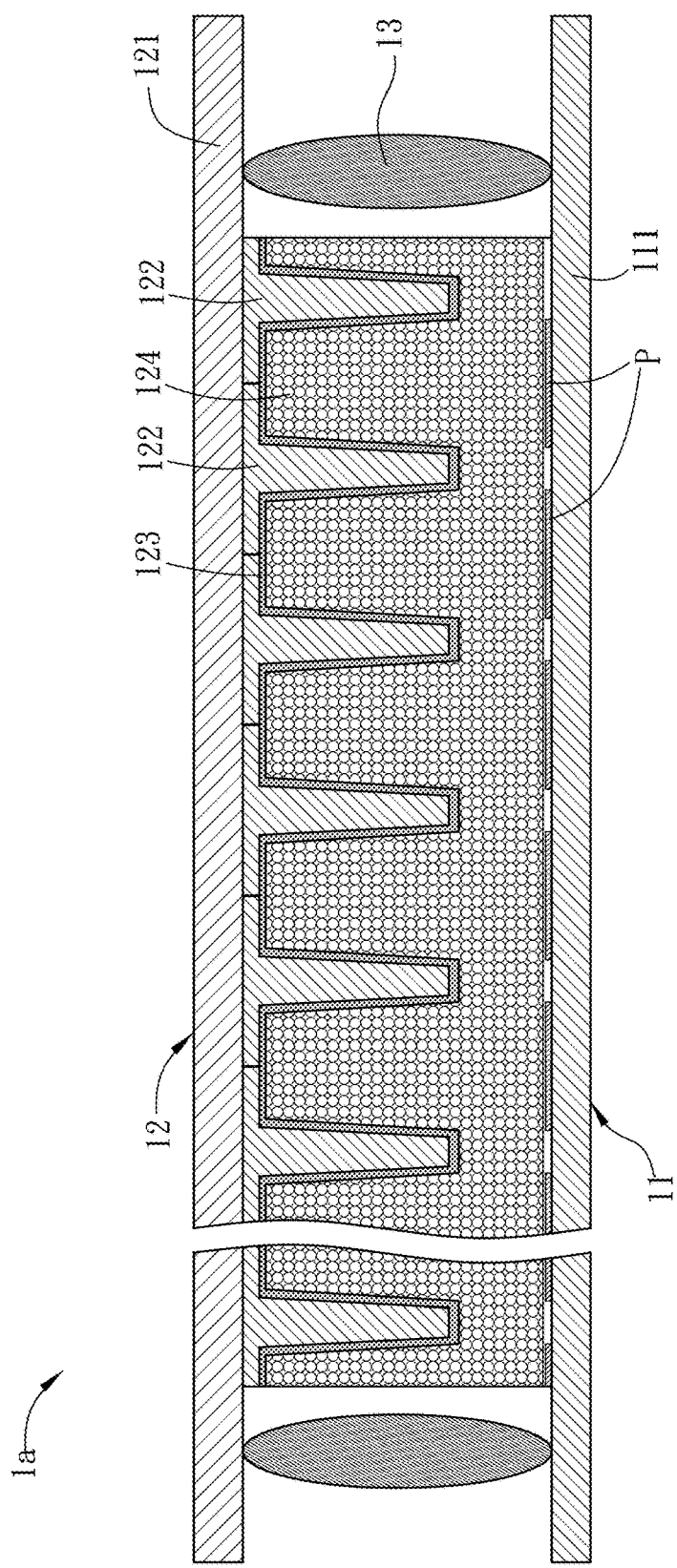
FIGS. 3 and 4 are schematic diagrams showing different aspects of the active matrix image sensing device.
Figure 4:
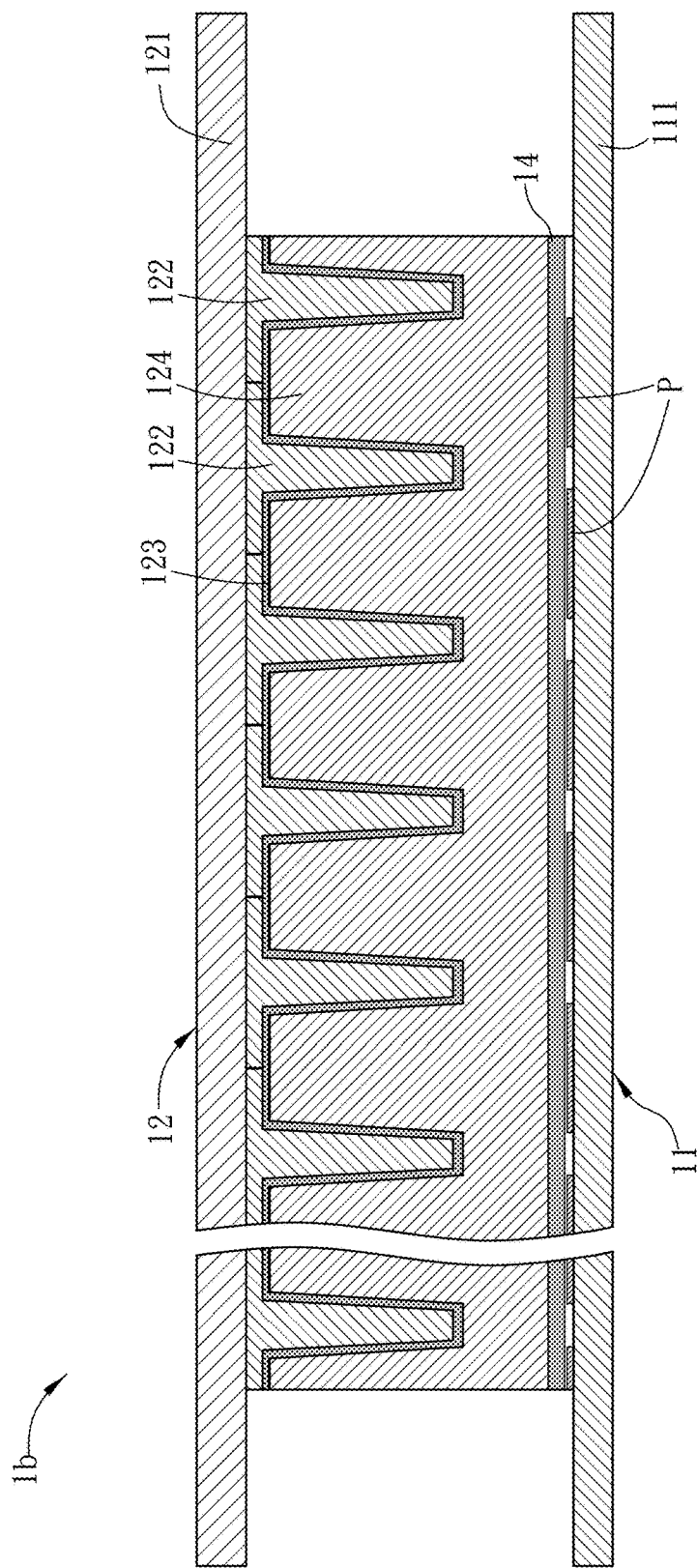

FIGS. 3 and 4 are schematic diagrams showing different aspects of the active matrix image sensing devices 1a and 1b.

The active matrix image sensing device 1a of FIG. 3 has an image sensing substrate 11 and a scintillator substrate 12, similar to the active matrix image sensing device 1 of FIG. 1. As shown in FIG. 3, the active matrix image sensing device 1a further includes a sealant 13 for sealing peripheries of the (first) substrate 121 and the (second) substrate 111. After aligning and assembling the image sensing substrate 11 and the scintillator substrate 12, the sealant 13 is provided to seal the peripheries of the substrates 111 and 121. In this embodiment, the sealant 13 can be, for example, a light curing adhesive (e.g. UV glue), and it can be disposed between the substrates 111 and 121 by, for example but not limited to, coating.

The active matrix image sensing device 1b of FIG. 4 has an image sensing substrate 11 and a scintillator substrate 12, similar to the active matrix image sensing device 1 of FIG. 1. As shown in FIG. 4, the active matrix image sensing device 1b further includes an adhesive layer 14 disposed between the image sensing substrate 11 and the scintillator layer 124. In this embodiment, the adhesive layer 14 is, for example but not limited to, an optical clear adhesive (OCA), which is configured for binding the image sensing substrate 11 and the scintillator layer 124 to form the active matrix image sensing device 1b.

The other technical features of the active matrix image sensing devices 1a and 1b can be referred to the same components of the above-mentioned active matrix image sensing device 1, so the detailed descriptions thereof will be omitted.

Figure 5:
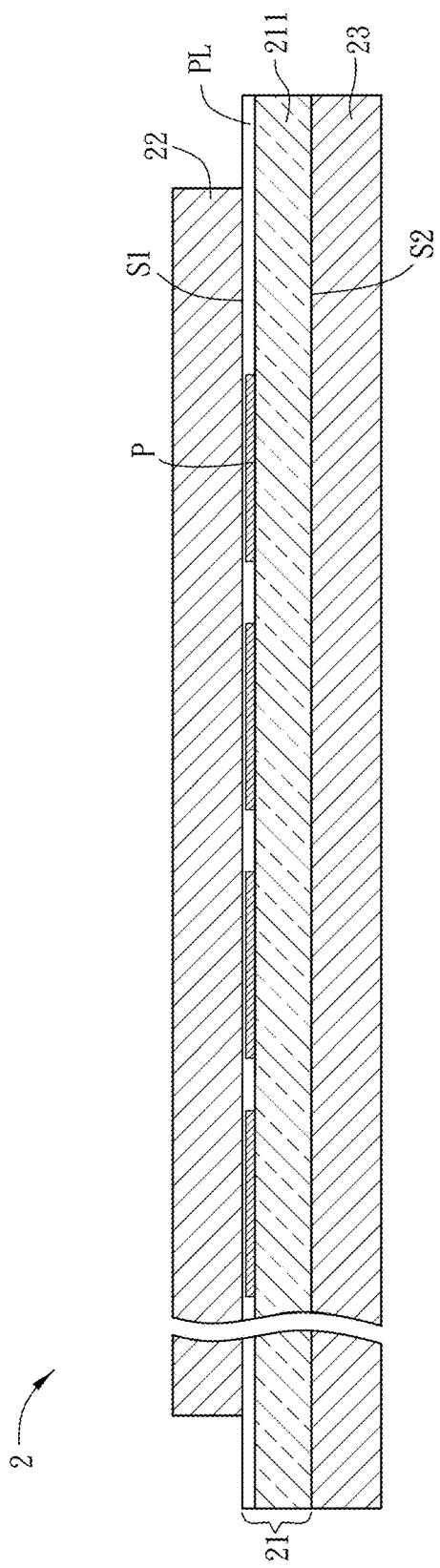
FIG. 5 is a schematic diagram of an active matrix image sensing device according to another embodiment of the disclosure.

FIG. 5 is a schematic diagram of an active matrix image sensing device 2 according to another embodiment of the disclosure.

The active matrix image sensing device 2 includes an image sensing substrate 21, a first scintillator layer 22, and a second scintillator layer 23.

The image sensing substrate 21 includes a flexible substrate. The image sensing substrate 21 has a first surface S1 and a second surface S2, which are opposite to each other. In this embodiment, the image sensing substrate 21 includes a flexible substrate 211 and a plurality of image sensing pixels P, and the image sensing pixels P are disposed on the flexible substrate 211. The flexible substrate 211 may include organic polymer material, which is a thermoplastic material such as polyimide (PI), polyethylene (PE), polyvinylchloride (PVC), polystyrene (PS), acrylic, fluoropolymer, polyester, or nylon. In this embodiment, the flexible substrate 211 is made of PI, and the thickness of the flexible substrate 211 is, for example, between 5 μm and 50 μm. Since the image sensing substrate 21 is flexible, the active matrix image sensing device 2 also becomes flexible. Accordingly, the flexible active matrix image sensing device 2 can be applied to various applications (e.g. curved X-ray sensor).

The components and technical features of the image sensing pixels of this embodiment are the same as those of the image sensing pixels of the active matrix image sensing device 1, so the detailed descriptions thereof will be omitted.

The first scintillator layer 22 is disposed on the first surface S1 of the image sensing substrate 21, and the second scintillator layer 23 is disposed on the second surface S2 of the image sensing substrate 21. Each of the first scintillator layer 22 and the second scintillator layer 23 includes a plurality of scintillators. The scintillators can be organic scintillators, inorganic scintillators or gas scintillators. In one embodiment, the first scintillator layer 22 and the second scintillator layer 23 are made of, for example but not limited to, gadolinium oxide sulfur (GOS, $Gd_2O_2S$), which can transform the X-ray into visible light.

FIG. 6A is another schematic diagram of the active matrix image sensing device 2a, and FIG. 6B is a schematic diagram showing a comparison example of an active matrix image sensing device 3. Herein, the active matrix image sensing device 3 is a comparison for illustrating the features of the active matrix image sensing device 2a.

Referring to FIG. 6A, the active matrix image sensing device 2a includes the active matrix image sensing device 2 of FIG. 5 and two reflective layers 24 and 25. The reflective layer 24 is disposed on the first scintillator layer 22 away from the first surface S1, and the reflective layer 25 is disposed on the second scintillator layer 23 away from the second surface S2. In this case, the reflective layer 24 is attached to the top surface of the first scintillator layer 22, and the reflective layer 25 is attached to the bottom surface of the second scintillator layer 23. The reflective layer 24 can reflect the light traveling upwardly and passing through the first scintillator layer 22, and the reflective layer 25 can reflect the light traveling downwardly and passing through the second scintillator layer 23. The reflected light can be received by the light sensing elements of the image sensing pixels of the image sensing substrate 21, thereby improving the light utility and increasing the accuracy of the read electronic signal. The reflective layers 24 and 25 are, for example, a metal coating layer or a reflective coating layer, which is made of reflective materials. The reflective materials may include metal (e.g. Al), metal oxide (e.g. $TiO_2$), high reflective paint, facet coating, or their combinations, and this disclosure is not limited.

As shown in FIG. 6B, the active matrix image sensing device 3 includes an image sensing substrate 31, a scintillator layer 32 and a reflective layer 34. The image sensing substrate 31 is disposed opposite to the scintillator layer 32, and the reflective layer 34 is attached to the top surface of the scintillator layer 32. The reflective layer 34 can reflect the light traveling upwardly and passing through the image sensing substrate 31, and the reflected light can be received by the light sensing elements of the image sensing substrate 31. For example, the thickness of the scintillator layer 32 is between 200 μm and 300 μm. In this embodiment, the thickness of the scintillator layer 32 is about 200 μm.

FIGS. 7A and 7B are schematic diagrams showing the spatial resolutions of the active matrix image sensing device 2a of FIG. 6A and the active matrix image sensing device 3 of FIG. 6B.

Referring to FIG. 7B, the thickness of the scintillator layer 32 of the active matrix image sensing device 3 is 200 μm. It is assumed that this scintillator layer 32 can completely transform the incident X-ray to the visible light.

As shown in FIG. 7A, the thicknesses of the first scintillator layer 22 and the second scintillator layer 23 of the active matrix image sensing device 2a are 100 μm respectively. Thus, the sum of the thicknesses of the scintillator layers in the active matrix image sensing device 2a is the same as the thickness of the scintillator layer in the active matrix image sensing device 3 of FIG. 7B, so that the first scintillator layer 22 and the second scintillator layer 23 can together completely transform the incident X-ray to the visible light. To be noted, in the image sensing pixel P of the image sensing substrate 21, the first terminal electrode E1 and the second terminal electrode E2 of the light sensing element PD are all transparent electrodes (e.g. ITO or IZO), so that the light reflected by the reflective layers 24 and 25 are not blocked.

Referring to FIGS. 7A and 7B, since the sum of the thicknesses of the first scintillator layer 22 and the second scintillator layer 23 is equal to the thickness of the scintillator layer 32 (200 μm), the light transform efficiencies (or the light absorption rates) of the active matrix image sensing devices 2a and 3 are the same. However, the thicknesses of the first scintillator layer 22 and the second scintillator layer 23 of the active matrix image sensing device 2a are thinner, so that under the condition of same light transform efficiency, the active matrix image sensing device 2a has a better spatial resolution than the active matrix image sensing device 3.

As mentioned above, according to some embodiments of the active matrix image sensing device, by means of disposing guiding members 122 on the scintillator substrate 12 in the position corresponding to the pixelated patterns of the image sensing substrate 11, disposing the reflective layer 123 on the guiding members 122, and disposing the scintillator layer 124 between the reflective layer 123 and the image sensing substrate 11, the traveling path of the light can be restricted. Accordingly, compared with the conventional technology, the active matrix image sensing device of the disclosure has higher spatial resolution.

Besides, according to some embodiments of the active matrix image sensing device, the image sensing substrate includes a flexible substrate, the first scintillator layer is disposed on the first surface of the image sensing substrate, and the second scintillator layer is disposed on the second surface of the image sensing substrate. Accordingly, the active matrix image sensing device of the embodiments has a better spatial resolution than the conventional active matrix image sensing device under the same light transform efficiencies (or the light absorption rates). In addition, since the image sensing substrate of this disclosure is flexible, the active matrix image sensing device also becomes flexible, so that it can be applied to more applications.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An active matrix image sensing device, comprising:
   an image sensing substrate having a plurality of image sensing pixels; and
   a scintillator substrate disposed opposite to the image sensing substrate and comprising:
      a first substrate;
      a plurality of guiding members disposed on the first substrate and protruded from the first substrate toward the image sensing substrate, wherein the guiding members are located corresponding to the image sensing pixels, respectively;
      a reflective layer disposed on the guiding members; and
      a scintillator layer disposed between the reflective layer and the image sensing substrate.

2. The active matrix image sensing device of claim 1, wherein the image sensing pixel comprises a light sensing element and a TFT (thin-film-transistor) element, the light sensing element has a first terminal electrode and a second terminal electrode, the TFT element has a first electrode, a second electrode and a gate, the first electrode is electrically connected to a data line, the second electrode is electrically connected to the first terminal electrode of the light sensing element, the gate is electrically connected to a scan line, and the second terminal electrode is electrically connected to a conductive layer.

3. The active matrix image sensing device of claim 2, wherein the first terminal electrode and the second terminal electrode are transparent electrodes.

4. The active matrix image sensing device of claim 2, wherein the light sensing element further comprises a first semiconductor layer, an intrinsic semiconductor layer, and a second semiconductor layer, and the intrinsic semiconductor layer is disposed between the first semiconductor layer and the second semiconductor layer.

5. The active matrix image sensing device of claim 1, wherein the guiding members form a plurality of openings, and the openings are disposed corresponding to the image sensing pixels, respectively.

6. The active matrix image sensing device of claim 1, wherein the scintillator layer has a top surface facing the image sensing substrate, and a minimum distance between the top surface and the reflective layer is between 20 μm and 200 μm.

7. The active matrix image sensing device of claim 1, wherein the scintillator layer has a top surface facing the image sensing substrate, and a maximum distance between the top surface and the reflective layer is between 100 μm and 300 μm.

8. The active matrix image sensing device of claim 1, wherein the image sensing substrate further comprises a second substrate, the image sensing pixels are disposed on the second substrate, and the active matrix image sensing device further comprises a sealant for sealing peripheries of the first substrate and the second substrate.

9. The active matrix image sensing device of claim 1, further comprising:
   an adhesive layer disposed between the image sensing substrate and the scintillator layer.

* * * * *